United States Patent
Slotboom et al.

(10) Patent No.: US 10,444,632 B2
(45) Date of Patent: *Oct. 15, 2019

(54) APPARATUS OPERABLE TO PERFORM A MEASUREMENT OPERATION ON A SUBSTRATE, LITHOGRAPHIC APPARATUS, AND METHOD OF PERFORMING A MEASUREMENT OPERATION ON A SUBSTRATE

(71) Applicant: ASML Netherlands B.V., Veldhoven (NL)

(72) Inventors: Daan Maurits Slotboom, Wolphaartsdijk (NL); Pieter Jacob Kramer, Veldhoven (NL); Martinus Hendrikus Antonius Leenders, Rhoon (NL); Bart Dinand Paarhuis, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/994,400

(22) Filed: May 31, 2018

(65) Prior Publication Data

US 2018/0364582 A1 Dec. 20, 2018

Related U.S. Application Data

(63) Continuation of application No. 15/111,457, filed as application No. PCT/EP2014/076678 on Dec. 5, 2014, now Pat. No. 9,989,858.

(30) Foreign Application Priority Data

Jan. 24, 2014 (EP) .................................. 14152452

(51) Int. Cl.
G03F 7/20 (2006.01)
G03F 9/00 (2006.01)

(52) U.S. Cl.
CPC ........ G03F 7/70141 (2013.01); G03F 9/7046 (2013.01); G03F 9/7096 (2013.01)

(58) Field of Classification Search
None
See application file for complete search history.

(56) References Cited

U.S. PATENT DOCUMENTS 6,587,744 B1 7/2003 Stoddard et al.
7,042,552 B1 5/2006 Werkman et al.
(Continued)

FOREIGN PATENT DOCUMENTS

CN 1371489 9/2002
CN 1797204 7/2006
(Continued)

OTHER PUBLICATIONS

Korean Notice of Allowance issued in corresponding Korean Application No. 10-2016-7023033, dated May 15, 2018, with English translation, 6 pages.
(Continued)

*Primary Examiner* — Steven Whitesell Gordon
(74) *Attorney, Agent, or Firm* — Pillsbury Winthrop Shaw Pittman LLP

(57) ABSTRACT

An apparatus and method for performing a measurement operation on a substrate in accordance with one or more substrate alignment models. The one or more substrate alignment models are selected from a plurality of candidate substrate alignment models. The apparatus, which may be a lithographic apparatus, includes an external interface which
(Continued)

enables selection of the substrate alignment model(s) and/or alteration of the substrate alignment model(s) prior to the measurement operation.

20 Claims, 4 Drawing Sheets

(56) References Cited

U.S. PATENT DOCUMENTS

| | | |
|---|---|---|
| 7,250,237 B2 | 7/2007 | Ottens et al. |
| 7,449,265 B1 | 11/2008 | Dixon |
| 7,462,429 B2 | 12/2008 | Menchtchikov et al. |
| 7,626,701 B2 | 12/2009 | Van Bilsen |
| 8,760,662 B2 | 6/2014 | Den Boef et al. |
| 2001/0041417 A1 | 11/2001 | Ohsaki |
| 2007/0238201 A1 | 10/2007 | Funk et al. |
| 2008/0183412 A1 | 7/2008 | Funk et al. |
| 2011/0216293 A1 | 9/2011 | Padiy et al. |
| 2012/0218533 A1 | 8/2012 | Lyulina |

FOREIGN PATENT DOCUMENTS

| | | |
|---|---|---|
| CN | 101410844 | 4/2009 |
| CN | 102053603 | 5/2011 |
| CN | 102650832 | 8/2012 |
| EP | 1 628 164 | 2/2006 |
| JP | 2003-502771 | 1/2003 |
| KR | 10-2008-0111105 | 12/2008 |
| KR | 10-2012-0104636 | 9/2012 |

OTHER PUBLICATIONS

International Search Report and Written Opinion dated Apr. 10, 2015 in corresponding International Patent Application No. PCT/EP2014/076678.

APPARATUS OPERABLE TO PERFORM A MEASUREMENT OPERATION ON A SUBSTRATE, LITHOGRAPHIC APPARATUS, AND METHOD OF PERFORMING A MEASUREMENT OPERATION ON A SUBSTRATE

This application is a continuation of U.S. patent application Ser. No. 15/111,457 filed Jul. 13, 2016, now allowed, which is the U.S. national phase entry of PCT patent application no. PCT/EP2014/076678, filed on Dec. 5, 2014, which claims the benefit of priority of European Patent Application No. 14152452.0, filed Jan. 24, 2014, which is incorporated by reference herein in its entirety.

FIELD

The present description relates to a method of performing a measurement operation on a substrate, for example during a lithographic process, and to an associated apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Prior to exposure of a wafer using a lithographic apparatus, the wafer needs to be modelled so as to properly align the wafer during exposure and to measure any wafer deformations for which allowance should be made during exposure. To properly model the wafer, the most appropriate wafer alignment model should be used, otherwise the modelling may actually introduce more noise to the measurements.

SUMMARY

It is desirable to provide an apparatus and method which improves wafer alignment model selection during a measurement process on a substrate.

According to an aspect of the invention, there is provided an apparatus operable to perform a measurement operation on a substrate in accordance with one or more wafer alignment models, wherein the one or more wafer alignment models are selected from a plurality of candidate wafer alignment models; and wherein the apparatus comprises an external interface operable to enable the selection of one or more wafer alignment models from the plurality of candidate wafer alignment models and/or alteration of one or more of the candidate wafer alignment model(s), prior to the measurement operation.

The external interface may enable the selection of the wafer alignment model(s) and/or alteration of the wafer alignment model(s) for each lot of substrates, or each substrate, prior to the measurement operation on each lot of substrates.

The apparatus may comprise the plurality of candidate wafer alignment models.

The apparatus may be operable to select one or more wafer alignment models from the plurality of candidate wafer alignment models according to a determination as to which model(s) would best fit a particular substrate or lot of substrates.

The apparatus may be operable to receive data relating to which of the one or more candidate wafer alignment models is to be selected, the determination as to which model(s) would best fit a particular substrate or lot of substrates having been performed externally to the apparatus.

The apparatus may be operable to select one or more of the candidate wafer alignment models based, at least in part, upon substrate processing context information of the particular substrate being measured.

The substrate processing context information may comprise information relating to a known processing characteristic imposed on a substrate as a result of processing on a particular tool.

The external interface may be an interface according to SEMI Equipment Communications Standard.

The apparatus may be operable to select one or more of the candidate wafer alignment models based, at least in part, upon post-exposure measurement data comprising measurements which have been taken from a previously exposed wafer subsequent to it being measured and exposed.

The apparatus may be operable: to measure the substrate thereby obtaining pre-exposure measurement data; to compare the post-exposure measurement data with the pre-exposure measurement data; and to use the result of the comparison in the selection of one of the candidate wafer alignment models for measurement of subsequent substrates.

The apparatus may be such that the result of the comparison is used to update one or more of the plurality of candidate wafer alignment models.

The apparatus may be operable such that the comparison determines whether the modelled post-exposure measurement data correlates to the pre-exposure measurement data; and to: attribute errors to substrate deformation if the modelled post-exposure measurement data correlates with the pre-exposure measurement data; and attribute errors to deformation of one or more measurement targets on the substrate if the modelled post-exposure measurement data does not correlate with the pre-exposure measurement data; and the apparatus may be further operable such that the selection of the wafer alignment model(s) is dependent at least in part on whether the errors are attributed to deformation of one or more measurement targets or attributed to substrate deformation.

The apparatus may be operable to receive the post-exposure data subsequent to it having been obtained using an external inspection tool.

The apparatus may comprise an inspection tool operable to measure substrates subsequent to exposure so as to obtain the post-exposure measurement data.

The apparatus may be operable to select one or more process correction models from a plurality of candidate process correction models, the process correction models being usable in modelling corrections for subsequent substrates.

The plurality of candidate wafer alignment models may comprise at least one physical wafer alignment model wherein the actual physics of substrate deformation is taken into account in the model.

The physical wafer alignment model may be operable such that measurement points which have physically nonsensical values, either in themselves or in the context of a measurement data set as a whole, are not considered or are given less weight in modelling of the substrate.

The apparatus may be specifically configured as a lithographic apparatus operable to perform a lithographic process on the substrate subsequent to the measurement operation.

According to a second aspect of the invention, there is provided a method of performing a measurement operation on a substrate comprising: determining as to which wafer alignment model(s) from a plurality of candidate wafer alignment models would best fit a particular substrate or lot of substrates; selecting one or more wafer alignment models from the plurality of candidate wafer alignment models based upon the determination; and performing the measurement operation on the substrate or lot of substrates in accordance with the selected one or more wafer alignment models; wherein the determining and selecting steps are performed at least per each lot of substrates.

The determining and selecting steps may be performed per each substrate.

The selection of the wafer alignment model(s) may be performed via an external interface comprised within a lithographic apparatus used to perform the measurement operation.

The external interface may be an interface according to SEMI Equipment Communications Standard.

The determination as to which model(s) would best fit a particular substrate or lot of substrates may be performed externally to the lithographic apparatus.

The determination as to which model(s) would best fit a particular substrate or lot of substrates may be performed within the lithographic apparatus.

The method may comprise the step of altering one or more of the candidate wafer alignment model(s) based upon the determination.

The method may comprise: obtaining substrate processing context information comprising information relating to a known processing characteristic imposed on a substrate as a result of processing on a particular tool; and making the selection of one or more wafer alignment models from the plurality of candidate wafer alignment models based, at least in part, upon the substrate processing context information of the particular substrate being measured.

The method may comprise: obtaining post-exposure measurement data comprising measurements which have been taken from a previously exposed wafer subsequent to it being measured and exposed; and making the selection of one or more wafer alignment models from the plurality of candidate wafer alignment models based, at least in part, upon the post-exposure measurement data.

The method may comprise: measuring the substrate thereby obtaining pre-exposure measurement data, comparing the post-exposure measurement data with the pre-exposure measurement data, and using the result of the comparison in the selection of one of the candidate wafer alignment models for measurement of subsequent substrates.

The method may comprise using the result of the comparison to update one or more of the plurality of candidate wafer alignment models.

The comparison step may determine whether the modelled post-exposure measurement data correlates to the pre-exposure measurement data; and the method may comprise: attributing errors to substrate deformation if the modelled post-exposure measurement data correlates with the pre-exposure measurement data; attributing errors to deformation of one or more measurement targets on the substrate if the modelled post-exposure measurement data does not correlate with the pre-exposure measurement data; and making the selection of one or more wafer alignment models from the plurality of candidate wafer alignment models dependent at least in part on whether the errors may be attributed to deformation of one or more measurement targets or attributed to substrate deformation.

The method may comprise the step of measuring substrates subsequent to exposure so as to obtain the post-exposure measurement data.

The plurality of candidate wafer alignment models may comprise at least one physical wafer alignment model wherein the actual physics of substrate deformation may be taken into account in the model.

The physical wafer alignment model may operate such that measurement points which have physically nonsensical values, either in themselves or in the context of a measurement data set as a whole, may be not considered or may be given less weight in modelling of the substrate.

The method may comprise performing a lithographic process on the substrate subsequent to the measurement operation.

In a third aspect of the invention there is provided a program comprising machine readable instructions which, when run on suitable apparatus, cause the apparatus to perform the method of any of the embodiments described in relation to the second aspect.

In a fourth aspect there is provided a program carrier comprising the program of third aspect.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
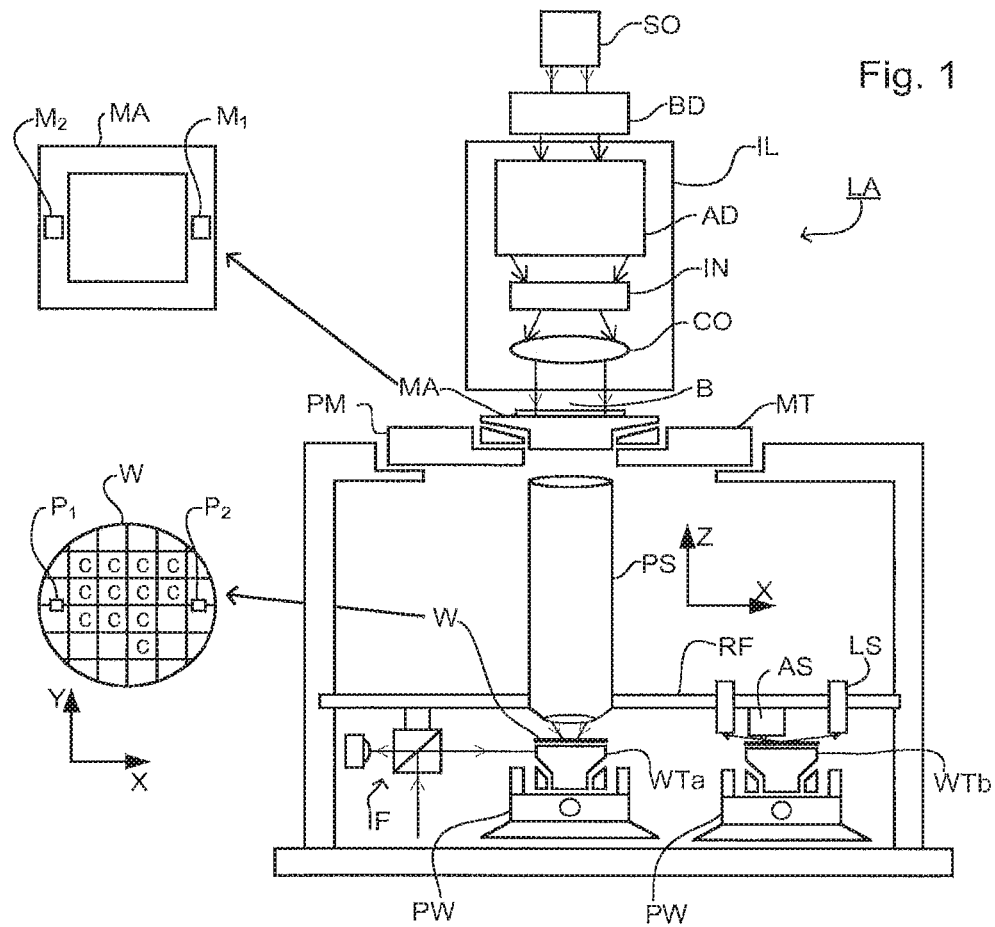
FIG. 1 depicts a lithographic apparatus.

FIG. 1 schematically depicts a lithographic apparatus. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
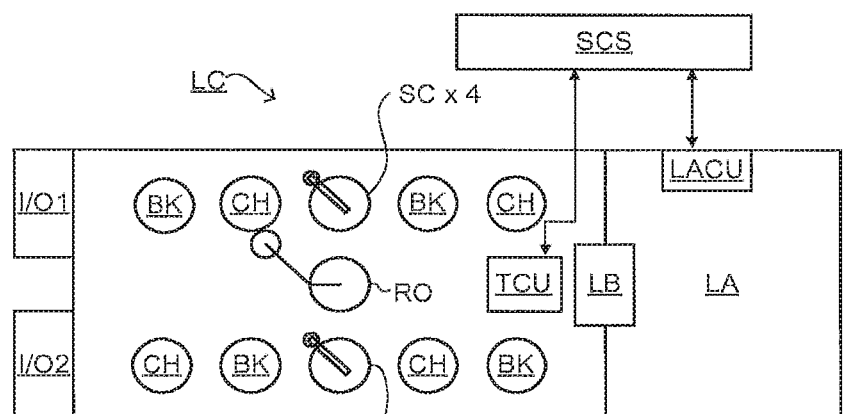
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
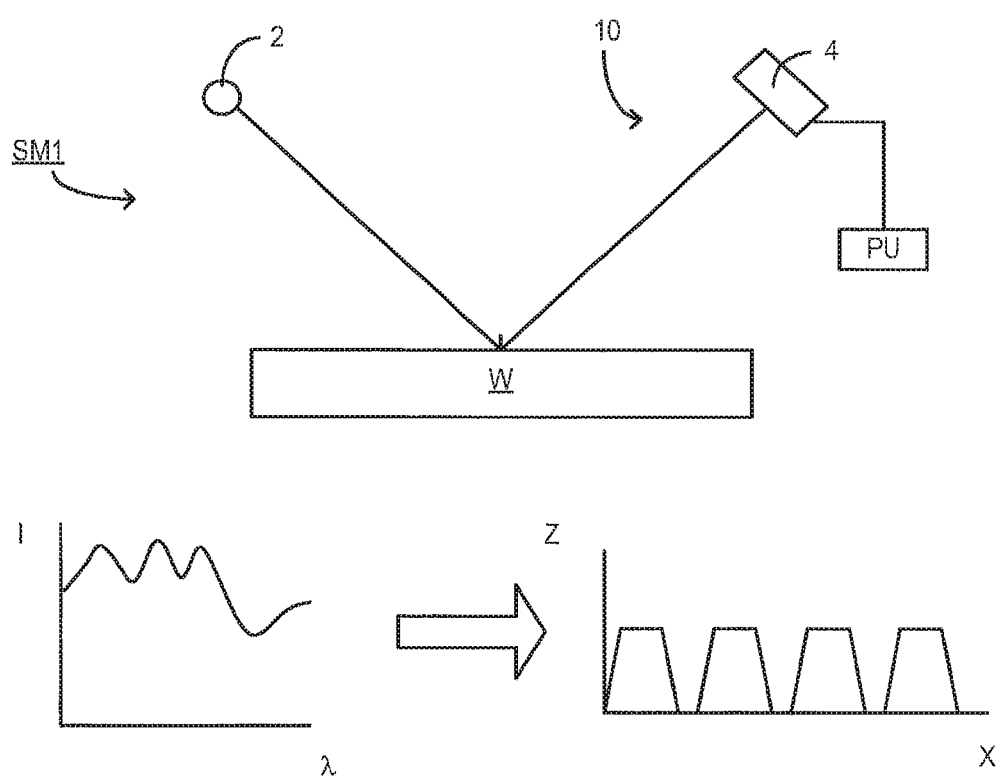
FIG. 3 depicts a first scatterometer.

FIG. 3 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
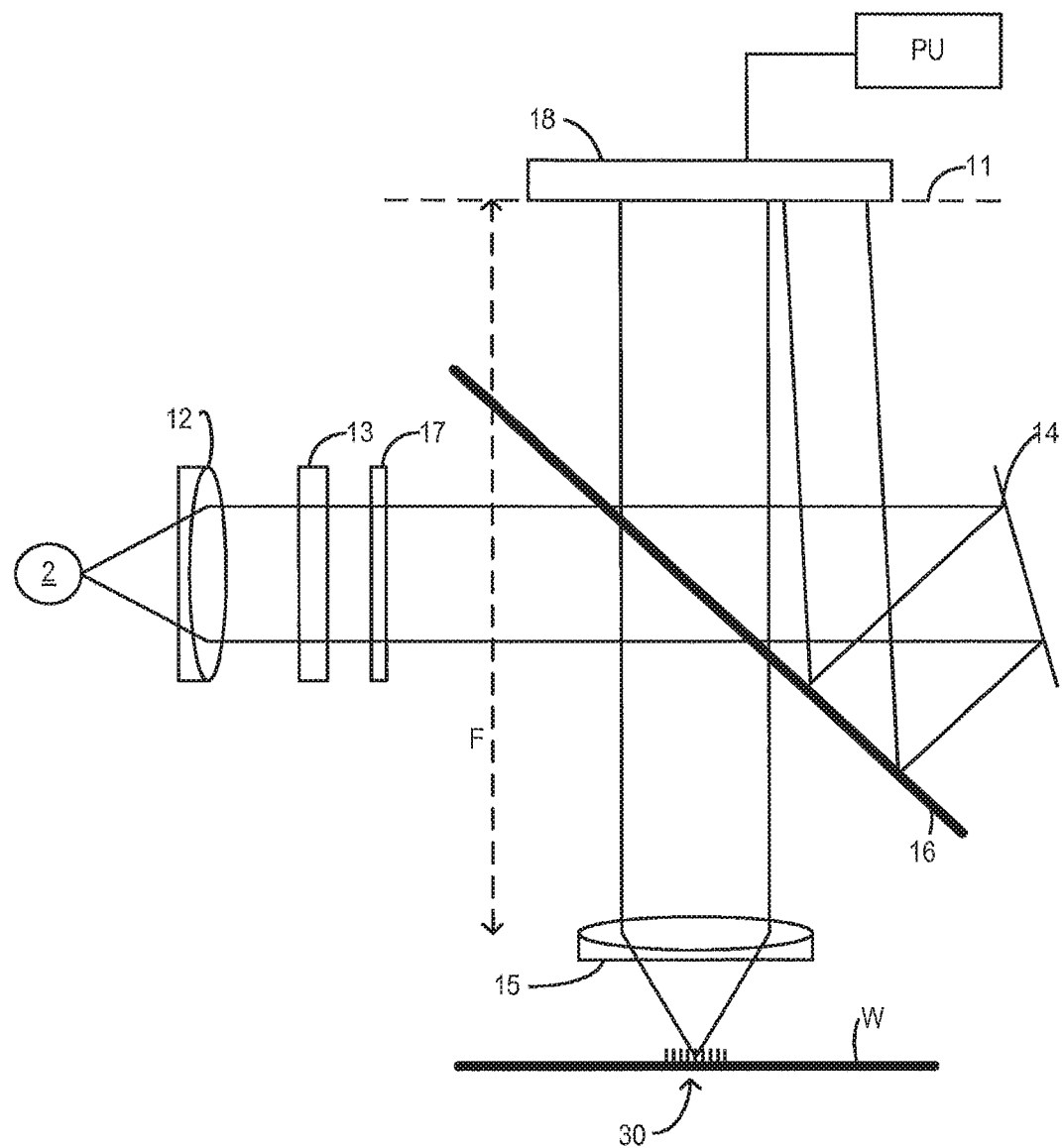
FIG. 4 depicts a second scatterometer.

Another scatterometer that may be used with an embodiment of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in European patent application publication no. EP1628164.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

Lithographic apparatus LA of FIG. 1 may comprise a so-called dual stage type which has two substrate tables and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 5:
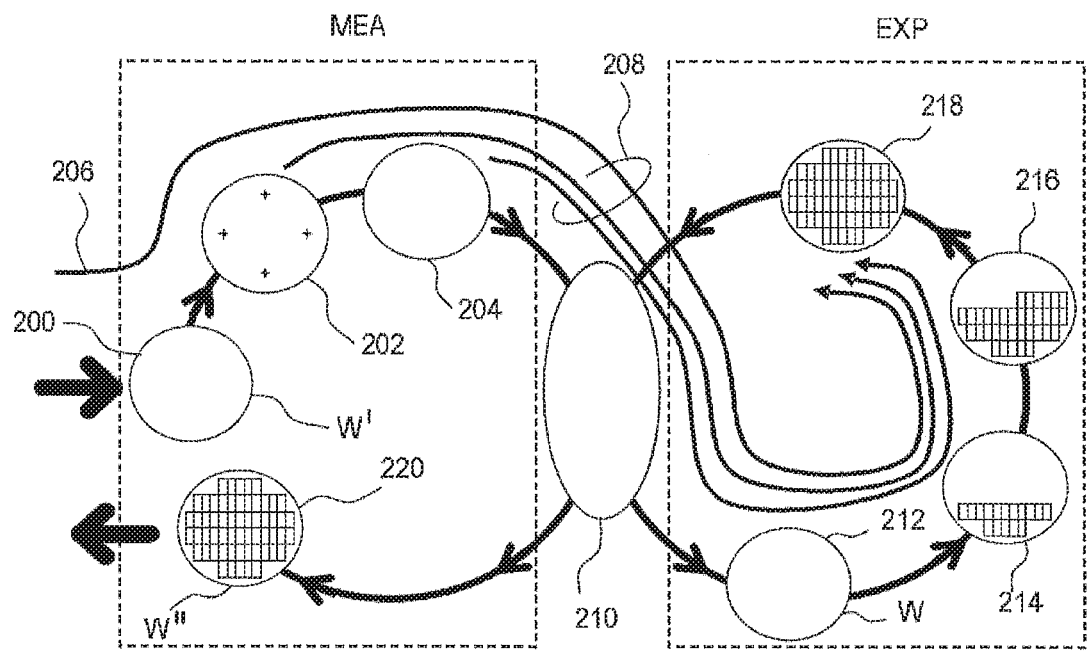
FIG. 5 illustrates schematically the stages in the measurement and exposure processes in a lithographic apparatus, according to known practice.

FIG. 5 illustrates the known steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table. In addition, several alignment marks across the substrate W' will be measured, to establish a "wafer grid", which maps very accurately the distribution of marks across the substrate, including any distortion relative to a nominal rectangular grid. At step 204, a map of wafer height against X-Y position is measured also, for use in accurate focusing of the exposed pattern.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At step 210, substrates W' and W are swapped, so that the measured substrate W' becomes the substrate W entering the exposure station EXP. This swapping is performed by exchanging the supports within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

During measurement of a substrate, a standard set of measurements are performed to characterize each wafer and the patterns previously deposited upon it. These measurements may be performed in accordance with a wafer alignment model, which may take one of a number of different forms. A first type of alignment model may be a linear alignment model, having (for example) four or six parameters. In addition there are more advanced alignment models. For the most demanding processes currently under development, achieving the desired overlay performance requires more detailed corrections of the wafer grid. Advanced alignment models have been developed for this purpose. In this text, 'advanced' alignment models refers to all type of models with more complexity than the standard six parameters. While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models.

Table 1 below lists a number of such alignment models, with some of their advantages and disadvantages.

TABLE 1

| Nr | Model | Advantage | Disadvantage |
|---|---|---|---|
| 1 | Linear models (4Par/6Par) | Simple; terms have physical meaning More markers will lead to noise suppression. | Process induced effects are seldom linear. Model does not describe physics better with more marks. |
| 2 | Polynomial model (Higher Order Wafer Alignment-HOWA) | Relatively simple. Usable in APC-loops. | Polynomials extrapolate poorly; models contribution too large on edge fields. This can only be partially solved by incorporating alignment marks on the edge |

TABLE 1-continued

| Nr | Model | Advantage | Disadvantage |
|---|---|---|---|
| | | | Effects on one side of the wafer can propagate through the rest of wafer. Superseding layers also need similar models. Requires more measurement points with respect to item 1. |
| 3 | Non-linear model (RBF) | Extrapolation error controllable. Local behavior of model can be used to correct local deformations. | Local behavior of model requires more measurement points with respect to items 1 and 2. High sensitivity to measure grid and contamination. Wafer Alignment errors contribute directly to overlay. |
| 4 | Zone alignment (ZA) | Local behavior of model can be used to correct local deformations. | Increased sensitivity to measure grid. Local behavior of model requires more measurement points with respect to items 1 and 2. |
| 5 | Extended zone alignment (EZA) | Reduced local behavior of model can be used to correct deformations. | Increased sensitivity to measure grid. Local behavior of model requires more measurement points with respect to items 1 and 2. |
| 6 | Die-by-die alignment (ZA with very small radius) | Very local behavior of model can be used to correct deformations per die. | Requires the most measurement points of all. The number of parameters (P) times the number of fields (F) would lead to (PF) alignment markers per wafer |
| 7 | Intrafield wafer alignment (IFWA) | Additional correction of intrafield effects Can be useful for slow effects (for example Lens Heating) | Too generic to cope with local and no-linear behavior of wafer deformation. |

Deciding which model or models to use, and thus which fingerprint to correct for, may be based upon a determination of the correlation between alignment measurements (performed prior to exposure by the lithographic apparatus) and overlay measurements (performed after exposure usually using a spectrometry device or similar inspection tool). In principle every lot (of the same product/layer) and/or every wafer can use a different model (or models). However wafer alignment models cannot be changed via an external interface (i.e. interface according to SEMI Equipment Communications Standard (SECS)) on a lot-to-lot (or wafer-to-wafer) basis. The SEMI Equipment Communication Standard (SECS) is published by Semiconductor Equipment and Materials International (SEMI). It defines a computer to computer communications interface between a unit of factory Equipment and a Host Computer. The lack of such an external interface means that adjusting wafer alignment models on a per lot basis prior to measurement is very labor intensive work. This administrative task should be done either offline or on the machine itself. This is often too burdensome a task, and hence a user often chooses a model which will best fit the content of all lots to come.

A SECS interface is provided on the exposure side of a lithographic apparatus to enable the wafer alignment model to be changed on a per wafer basis during exposure. No such SECS interface, nor any external interface, exists on the measurement side of the lithographic apparatus. Therefore it is very labour intensive to change the wafer alignment model on a per lot basis, and impossible practically (unless single lot wafers are used which will create an enormous amount of administration for the factory, decreasing productivity) to change the wafer alignment model on a per wafer basis on the measurement side (that is prior to measurement of the wafer pre-exposure).

It is therefore proposed to provide a lithographic apparatus which comprises an external interface, such as a SECS interface or interface according to presently used method for communication with ASML TwinScan apparatus, operable to allow wafer alignment model changes on a per lot, and in an embodiment, on a per wafer basis prior to wafer measurement. Where the lithographic apparatus is of a dual stage type, the interface may be provided on the measurement side. However an embodiment of the invention is not limited to such dual stage apparatus.

The models can be chosen and/or altered based upon feedback, with an inspection tool (i.e. a scatterometer) used to measure any overlay errors (or other errors) such that the measured errors are and minimized for in future wafers/lots by selection of a better performing wafer alignment model (or models). Alternatively, or in addition, the models can be chosen based upon processing context information which is fed forward to the lithographic apparatus prior to wafer measurement.

Processing context information may comprise information regarding known fingerprints imposed on a wafer grid by a processing step or particular processing tool. A wafer may go through a number of processing steps prior to loading onto the lithographic apparatus for measurement and exposure. Such steps may include etching, resist coating, annealing, epitaxial growth techniques, direction orientation of specific layer designs, etc. Wafer processing is the main reason for wafer grid deformation in the context of on-product overlay. The processing steps undertaken by a particular wafer, and the specific processing tools used for each step are known. Also it will be known if a particular tool imparts a particular distortion, distortion pattern or fingerprint. It is this information which may be used for selection of a particular wafer alignment model, or model combination.

By way of specific example, there may be a number of etching tools within a fabrication plant and it may be known that one tool imparts a fingerprint which is better modelled using a different wafer alignment model than that appropriate for the fingerprints imparted by the other etching tools. The external interface means that the wafer alignment model appropriate for the fingerprint imparted by this one tool can be selected on a per wafer basis for each wafer processed by that particular tool.

Figure 6:
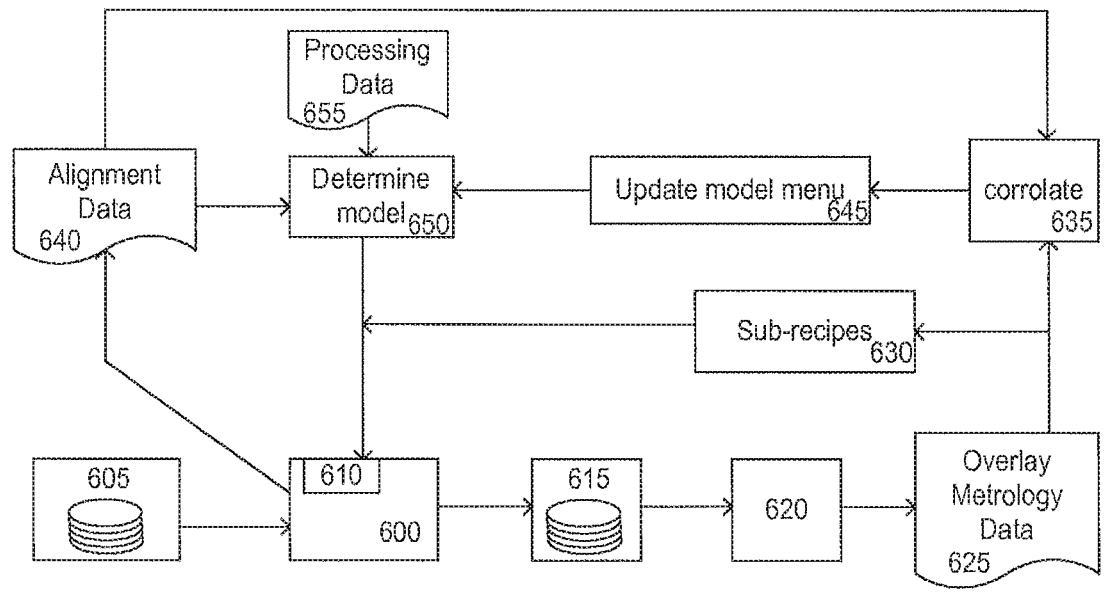
FIG. 6 illustrates schematically the stages in measurement and exposure processes according to an embodiment of the invention.

FIG. 6 is a flow diagram illustrating how such an arrangement may operate. Shown is a lithographic apparatus 600, into which are loaded pre-exposure wafers 605. The lithographic apparatus comprises an external interface 610, such as a SECS interface, allowing selection and/or altering of the wafer alignment model on a per lot and/or per wafer basis prior to wafer measurement. The lithographic apparatus is able to select an appropriate wafer alignment model based upon information received at external interface 610 and perform alignment/measurement and exposure operations on the loaded wafer 605. The exposed wafer 615 is unloaded from lithographic apparatus 600 and loaded onto inspection apparatus 620. The output of inspection apparatus 620 is overlay metrology data 625. Wafer alignment model sub-recipes 630 are determined form the overlay metrology data 625 and fed into the external interface 610. A correlation operation 635 is performed on the overlay metrology data 625 and alignment data 640 output from the lithographic apparatus 600. The result of the correlation operation may be used to identify new fingerprints for updating of the wafer alignment model menu 645. The alignment model menu 645 may actually be comprised within lithographic apparatus 600. Finally the appropriate wafer alignment model (or combination of models), which best describes the wafer(s), is chosen 650 from the model menu 645 based upon alignment data 640 and/or process context data 655 and/or the result of correlation 635. The determined model is then fed into the lithographic apparatus 600 via external interface 610.

It should be noted that the process outlined in FIG. 6 is exemplary and the feedback loop, for example, is not essential. It may be beneficial to select an appropriate model based upon processing context data 655 alone. Equally it may be beneficial to select an appropriate model based upon overlay metrology data 625 and alignment data 640 alone.

The correlation step 635 may comprise modelling each processed wafer 615 on scatterometer 620 using the same wafer alignment model as that used during measurement. The scatterometer 620 uses different targets than those used by the lithographic apparatus 600 alignment system, and therefore this step should be performed on the scatterometer marks that are closest to the wafer alignment marks. The modelled data from the scatterometer 620 can then be compared with that from the lithographic apparatus 600.

The analysis on which the preferred wafer alignment model determination is based may be performed either within or outside of the lithographic apparatus 600. The method may also comprise determining the best process correction model based upon alignment data 640 and/or process context data 655 and/or the result of correlation 635.

One issue which can impact on whether a wafer alignment model is most suitable is whether errors are attributable to wafer grid deformation or wafer alignment target deformation. A wafer alignment model such as HOWA is beneficial where there are wafer grid distortions, but actually introduces noise if used on a wafer with very little wafer grid distortion, such as when the majority of errors result from wafer alignment target deformation. Consequently, in the correlation step 635, a determination can be made as to whether the scatterometer model is similar to the lithographic apparatus model. If it is, then any errors are attributable to wafer grid deformation, and (if warranted) HOWA may be used. If the model results are different then there is likely to be wafer alignment target deformation and HOWA should be avoided. In another embodiment, it may be known that a particular processing tool imparts a wafer alignment target deformation to a wafer, and this information can be fed forward as processing context data 655 on which model determination may be made.

Considering now the wafer alignment model menu content, there are several reasons why the wafer grid can deform. These include:

Wafer grid distortion caused by stress and strain due to:
    Temperature steps (Annealing)
    Etch techniques
    Epitaxial growth techniques
    Material deposition
    Direction orientation of specific layer designs
Wafer grid distortion due to physical deformations not related to processing
    clamping
    thermal effects of scanner or track.

The wafer alignment functionality should correct for these effects.

There are also several effects which induce pseudo wafer grid deformations. Wafer processing and measurement artefacts are two of the main causes of on-product overlay error. These effects include:

Apparent wafer grid distortion caused by alignment artefacts due to:
    CMP (chemical mechanical polishing)
    Material deposition
    Etch techniques
Wafer grid distortion due to measurement systems errors (mirrors/grid plates, sensors).
Local deformations caused by a spot due to contamination.

The wafer alignment functionality should not correct for these effects as these are only detected by the wafer alignment sensor and not by the overlay metrology. These effects may also result in an average fingerprint and a varying fingerprint from wafer to wafer.

Both the presence of global and local effects and the poor behavior of existing models are reason to search for better alternatives. For this reason the 6-parameter model has been extended with higher-order models, consisting of polynomial terms of higher degree in x and y ($x^2$, xy, $y^2$ and so on). However, these high-order models might perform worse than expected. By using polynomials instead of physical models, the wafer alignment models tend to describe physical deformations using mathematical models. As a consequence:

a. Current wafer alignment models cannot distinguish between real wafer grid distortion and pseudo effects caused by alignment artifacts, i.e., errors which should be corrected for and errors which should not be corrected for (noise).

b. On the edge of the wafer the model contribution is sometimes too large due to well-known Runge's phenomenon: problem of oscillation at the edges of an interval which occurs when polynomials with high values of degree N are used for interpolation.
  c. Fitting higher order fingerprints will result even more measurement points.

Therefore, in an embodiment it is proposed to use physical wafer alignment models instead of purely mathematical models such as models based on mathematical series expansions, when performing the correlation step 635 and/or measuring the wafer. Physical wafer alignment models describing wafer deformation are not susceptible to wafer alignment target deformation and should therefore be part of the wafer alignment model menu.

The physical model takes into account the physics of wafer processing. Instead of all alignment targets being fitted with equal weight, only those targets which behave according to the physics of wafer deformation are fitted. Any alignment target which does not behave according to the physics of the deformed wafer or physical model must then be deformed by itself and should be ignored. For example, if all measured points on a wafer, except one, indicate wafer expansion, then that single point must be wrong and should be ignored. It is physically impossible for there to be expansion over a wafer except at one point. However, a purely mathematical model would fit that point, treating it the same as all the other points.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An apparatus configured to supply information to an apparatus configured to perform a measurement operation on a substrate in accordance with one or more substrate alignment models, wherein the one or more substrate alignment models are selected from a plurality of candidate substrate alignment models; and wherein the apparatus configured to perform the measurement operation comprises an external interface configured to enable the selection of the one or more substrate alignment models from the plurality of candidate substrate alignment models and/or alteration of one or more candidate substrate alignment models of the candidate substrate alignment models, prior to the measurement operation, and the apparatus configured to supply information is configured to provide information to the external interface to enable the selection and/or alteration.

2. The apparatus as claimed in claim 1, wherein the external interface enables the selection of the substrate alignment model(s) and/or alteration of the substrate alignment model(s) for each lot of substrates, prior to the measurement operation on each lot of substrates, and the apparatus configured to supply information is configured to provide information to the external interface to enable the selection and/or alteration of the substrate alignment model(s) for each lot of substrates.

3. The apparatus as claimed in claim 1, wherein the external interface enables the selection of the substrate alignment model(s) and/or alteration of the substrate alignment model(s) for each substrate, prior to the measurement operation on each substrate, and the apparatus configured to supply information is configured to provide information to the external interface to enable the selection and/or alteration of the substrate alignment model(s) for each substrate.

4. The apparatus as claimed in claim 1, configured to select one or more substrate alignment models from the plurality of candidate substrate alignment models according to a determination as to which model(s) would best fit a particular substrate or lot of substrates.

5. The apparatus as claimed in claim 1, configured to select one or more of the candidate substrate alignment models based, at least in part, upon substrate processing context information of the particular substrate being measured.

6. The apparatus as claimed in claim 1, wherein the external interface is an interface according to a semiconductor equipment industry standard.

7. The apparatus as claimed in claim 1, configured to select one or more of the candidate substrate alignment models based, at least in part, upon post-exposure measurement data comprising measurements which have been taken from a previously exposed substrate subsequent to it being measured and exposed.

8. The apparatus as claimed in claim 7, configured:
to measure the substrate to obtain pre-exposure measurement data;
to compare the post-exposure measurement data with the pre-exposure measurement data; and
to use the result of the comparison in the selection of one or more of the candidate substrate alignment models for measurement of subsequent substrates.

9. The apparatus as claimed in claim 8, configured such that the comparison determines whether modelled post-exposure measurement data correlates to the pre-exposure measurement data; and configured to:
attribute errors to substrate deformation if the modelled post-exposure measurement data correlates with the pre-exposure measurement data; and
attribute errors to deformation of one or more measurement targets on the substrate if the modelled post-exposure measurement data does not correlate with the pre-exposure measurement data;
the apparatus further configured such that the selection of the substrate alignment model(s) is dependent at least in part on whether the errors are attributed to deformation of one or more measurement targets or attributed to substrate deformation.

10. The apparatus as claimed in claim 1, configured to select one or more process correction models from a plurality of candidate process correction models, the process correction models being usable in modelling corrections for subsequent substrates.

11. The apparatus as claimed in claim 1, wherein the plurality of candidate substrate alignment models comprise at least one physical substrate alignment model wherein the actual physics of substrate deformation is taken into account in the model.

12. The apparatus as claimed in claim 11, wherein the physical substrate alignment model is configured such that measurement points which have physically nonsensical values, either in themselves or in the context of a measurement data set as a whole, are not considered or are given less weight in modelling of the substrate.

13. The apparatus as claimed in claim 1, wherein the apparatus configured to perform the measurement operation is specifically configured as a lithographic apparatus operable to perform a lithographic process on the substrate subsequent to the measurement operation.

14. A method of performing a measurement operation on a substrate, the method comprising:
obtaining substrate context information comprising information relating to known processing of a substrate by one or more particular tools;
selecting one or more substrate alignment models from the plurality of candidate substrate alignment models based upon the substrate context information; and
performing the measurement operation on the substrate or lot of substrates in accordance with the selected one or more substrate alignment models;
wherein the selecting is performed either per each lot of substrates such that one lot of a particular device manufacturing process has a different substrate alignment model than another lot of the particular device manufacturing process, or per substrate such that one substrate of a lot of a particular device manufacturing process has a different substrate alignment model than another substrate of the lot.

15. The method of claim 14, further comprising:
obtaining post-exposure measurement data comprising measurements which have been taken from a previously exposed substrate subsequent to it being measured and exposed; and
making the selection of the substrate alignment model(s) based, at least in part, upon the post-exposure measurement data.

16. A non-transitory program carrier comprising machine readable instructions which, when run on a suitable apparatus, cause the apparatus to at least:
obtain substrate context information comprising information relating to relating to known processing of a substrate by one or more particular tools;
select one or more substrate alignment models from the plurality of candidate substrate alignment models based upon the substrate context information; and
cause performance of a measurement operation on the substrate or lot of substrates in accordance with the selected one or more substrate alignment models,
wherein the selection is performed either per each lot of substrates such that one lot of a particular device manufacturing process can have a different substrate alignment model than another lot of the particular device manufacturing process, or per substrate such that one substrate of a lot of a particular device manufacturing process can have a different substrate alignment model than another substrate of the lot.

17. The program carrier of claim 16, wherein the instructions are further configured to cause the apparatus to enable selection of the substrate alignment model(s) via an external interface comprised within a lithographic apparatus used to perform the measurement operation.

18. The program carrier of claim 15, wherein the instructions are further configured to cause the apparatus to:
obtain post-exposure measurement data comprising measurements which have been taken from a previously exposed substrate subsequent to it being measured and exposed; and
make the selection of the substrate alignment model(s) based, at least in part, upon the post-exposure measurement data.

19. The program carrier of claim 18, wherein the instructions are further configured to cause the apparatus to:
obtain pre-exposure measurement data of the substrate;
compare the post-exposure measurement data with the pre-exposure measurement data;
use the result of the comparison in the selection of the substrate alignment model(s) for measurement of subsequent substrates.

20. The program carrier of claim 16, wherein the plurality of candidate substrate alignment models comprise at least one physical substrate alignment model wherein the actual physics of substrate deformation are taken into account in the model.

* * * * *